(12) United States Patent
Sekiya

(10) Patent No.: US 12,424,478 B2
(45) Date of Patent: Sep. 23, 2025

(54) APPARATUS FOR AND METHOD OF PROCESSING WORKPIECE

(71) Applicant: DISCO CORPORATION, Tokyo (JP)

(72) Inventor: Kazuma Sekiya, Tokyo (JP)

(73) Assignee: DISCO CORPORATION, Tokyo (JP)

(*) Notice: Subject to any disclaimer, the term of this patent is extended or adjusted under 35 U.S.C. 154(b) by 386 days.

(21) Appl. No.: 18/323,567

(22) Filed: May 25, 2023

(65) Prior Publication Data

US 2023/0390878 A1    Dec. 7, 2023

(30) Foreign Application Priority Data

Jun. 2, 2022 (JP) .................................. 2022-090487

(51) Int. Cl.
    *H01L 21/683*      (2006.01)
    *H01L 21/67*      (2006.01)

(52) U.S. Cl.
    CPC .... *H01L 21/6835* (2013.01); *H01L 21/67092* (2013.01); *H01L 21/67132* (2013.01)

(58) Field of Classification Search
    CPC ........... H01L 21/67005; H01L 21/6773; H01L 21/67739; H01L 21/6831; H01L 21/6833; H01L 21/6834; H01L 21/683; H01L 21/6836; H01L 21/687; H01L 21/68714
See application file for complete search history.

(56) References Cited

U.S. PATENT DOCUMENTS

| 2008/0023120 A1* | 1/2008 | Rochman | .................... | C09J 7/22 156/60 |
| 2014/0318575 A1* | 10/2014 | Parkhe | .............. | H01J 37/32862 279/157 |

FOREIGN PATENT DOCUMENTS

JP      2010251603 A      11/2010

* cited by examiner

*Primary Examiner* — Tyrone V Hall, Jr.
(74) *Attorney, Agent, or Firm* — Greer Burns & Crain Ltd.

(57) ABSTRACT

An apparatus for processing a workpiece includes a holding table having a holding surface for holding the workpiece thereon, a processing unit for processing the workpiece held on the holding surface of the holding table, and a table cover for covering the holding surface when the workpiece is not held on the holding surface. The table cover has a contact surface for contacting at least the holding surface of the holding table, the contact surface being adhesive in nature.

7 Claims, 8 Drawing Sheets

APPARATUS FOR AND METHOD OF PROCESSING WORKPIECE

BACKGROUND OF THE INVENTION

Field of the Invention

The present invention relates to an apparatus for and a method of processing a workpiece.

Description of the Related Art

There has been known an apparatus for processing, e.g., machining, cleaning, or inspecting, a workpiece held on a holding table (see, for example, Japanese Patent Laid-open No. 2010-251603).

SUMMARY OF THE INVENTION

When no workpiece is held on the holding table and, as a result, the holding table has its holding surface exposed, foreign matter such as swarf or a mist or liquid containing swarf tends to fall on and smear the exposed surface. If a workpiece is held on the smeared holding surface and processed, then the processed workpiece is likely to have its quality lowered.

It is therefore an object of the present invention to provide an apparatus for and a method of processing a workpiece while preventing foreign matter from being attached to a holding surface for holding the workpiece thereon.

In accordance with an aspect of the present invention, there is provided an apparatus for processing a workpiece, including a holding table having a holding surface for holding the workpiece thereon, a processing unit for processing the workpiece held on the holding surface of the holding table, and a table cover for covering the holding surface when the workpiece is not held on the holding surface. The table cover has a contact surface for contacting at least the holding surface of the holding table, the contact surface being adhesive in nature.

Preferably, the table cover includes either an annular frame having a central opening and a sheet affixed to the annular frame or a plate-shaped member and a sheet affixed to the plate-shaped member.

Preferably, the apparatus further includes a cassette for housing the workpiece therein and a delivery unit for delivering the workpiece between the cassette and the holding table. In this case, the table cover is housed in the cassette shared with the workpiece and is delivered between the cassette and the holding table by the delivery unit shared with the workpiece.

Preferably, the apparatus further includes a cassette for housing the workpiece therein, a table cover receptacle for housing the table cover, and a delivery unit for delivering the workpiece between the cassette and the holding table. In this case, the table cover is delivered between the table cover receptacle and the holding table by the delivery unit shared with the workpiece.

In accordance with another aspect of the present invention, there is provided a method of processing a workpiece, including a holding step of delivering the workpiece from a cassette to a holding table with use of a delivery unit and holding the workpiece on a holding surface of the holding table, a processing step of processing the workpiece held on the holding surface with use of a processing unit, and a table cover holding step of holding a table cover on the holding surface when the workpiece is not held on the holding surface.

Preferably, the method further includes a table cover unloading step of unloading the table cover from the holding table. In this case, the table cover has a contact surface for contacting at least the holding surface of the holding table, the contact surface being adhesive in nature.

Preferably, the table cover includes either an annular frame having a central opening and a sheet affixed to the annular frame or a plate-shaped member and a sheet affixed to the plate-shaped member.

According to the aspects of the present invention, since the holding surface of the holding table is covered with the table cover when the workpiece is not held on the holding surface, the holding surface is not left exposed, so that foreign matter is prevented from being deposited on the holding surface.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
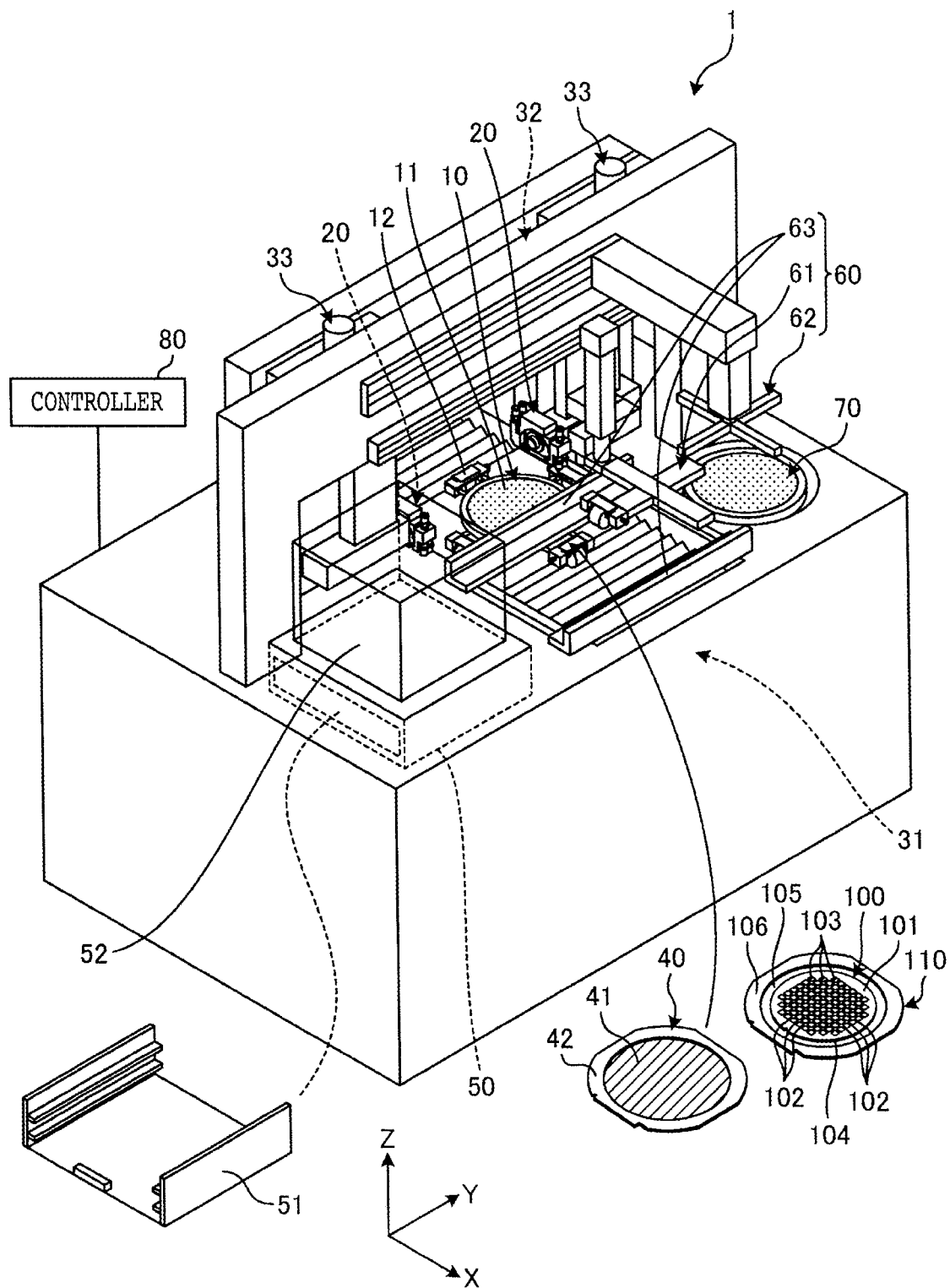
FIG. 1 is a perspective view, partly in block form, illustrating a structural example of an apparatus for processing a workpiece according to an embodiment of the present invention.

Preferred embodiments of the present invention will be described in detail hereinbelow with reference to the accompanying drawings. The present invention is not limited to the details of the embodiments described below. The components described below cover those which could easily be anticipated by those skilled in the art and those which are essentially identical to those described below. Further, the arrangements described below can be combined in appropriate manners. Various omissions, replacements, or changes of the arrangements may be made without departing from the scope of the present invention. In the description below, those components that are identical to each other are denoted by identical reference characters.

An apparatus for and a method of processing a workpiece according to a preferred embodiment of the present invention will be described below with reference to the drawings. The apparatus for processing a workpiece will also be referred to as a "workpiece processing apparatus," and the method of processing a workpiece will also be referred to as a "workpiece processing method." FIG. 1 illustrates in perspective, partly in block form, a structural example of the workpiece processing apparatus, denoted by 1, according to the present embodiment. As illustrated in FIG. 1, the workpiece processing apparatus 1 includes a holding table 10, a pair of first processing units 20, an X-axis moving unit 31, a Y-axis moving unit 32, a Z-axis moving unit 33, a table cover 40, a cassette rest base 50, a delivery assembly 60, a second processing unit 70, and a controller 80.

As illustrated in FIG. 1, the workpiece, denoted by 100, to be processed by the workpiece processing apparatus 1 or the workpiece processing method includes a semiconductor wafer or optical device wafer shaped as a circular plate, made of a base material such as silicon, sapphire, silicon carbide (SiC), gallium arsenide, or glass, for example. The workpiece 100 has a plurality of chip-size devices 103 constructed in respective areas demarcated on a flat face side 101 thereof by a grid of projected dicing lines 102. According to the present embodiment, a circular adhesive tape 105 is affixed to a reverse side 104 of the workpiece 100, which faces opposite the face side 101. The adhesive tape 105 has an outer edge portion to which there is affixed an annular frame 106 having a central opening. The adhesive tape 105 whose outer edge portion is affixed to the annular frame 106 extends beneath the central opening of the annular frame 106, i.e., covers the central opening. The adhesive tape 105 and the annular frame 106 jointly make up a frame unit 110 that supports the workpiece 100 placed on the adhesive tape 105 and disposed in the central opening of the annular frame 106. The annular frame 106 is thus joined to the workpiece 100 by the adhesive tape 105. According to the present invention, however, the workpiece 100 may not necessarily be supported on the frame unit 110. The adhesive tape 105 includes a base layer made of synthetic resin and an adhesive glue layer made of adhesive synthetic resin that is disposed on a surface of the base layer. The glue layer is affixed to the reverse side 104 of the workpiece 100. According to the present invention, the workpiece 100 may alternatively include a rectangular packaged substrate, ceramic plate, glass plate, or the like having a plurality of resin-encapsulated devices.

According to the present embodiment, the holding table 10 includes a chuck table having a disk-shaped frame with an upwardly open cavity defined therein and a disk-shaped suction pad fitted in the cavity in the frame. The suction pad of the holding table 10 has a porous portion made of porous ceramic having a multiplicity of pores therein, and is fluidly connected to a vacuum suction source, not illustrated, through a vacuum suction channel, not illustrated. According to the present embodiment, the porous portion is made of alumina ceramic, for example. The suction pad of the holding table 10 has an upper surface acting as a holding surface 11 for holding the workpiece 100 placed thereon under a negative pressure that is transmitted from the vacuum suction source and is introduced into the suction pad. According to the present embodiment, the workpiece 100 with the face side 101 facing upwardly is placed on the holding surface 11 and held under suction with the adhesive tape 105 interposed between the reverse side 104 of the workpiece 100 and the holding surface 11. The suction pad and the vacuum suction source, and the vacuum suction channel that are combined with the holding table 10 make up a suction holding mechanism. The holding surface 11 lies flush with an upper surface of the frame of the holding table 10 and extends parallel to a horizontal plane also referred to as an XY plane that is defined by an X-axis and a Y-axis indicated respectively by directions indicated by arrows X and Y in FIG. 1. The X-axis extends parallel to horizontal directions, and the Y-axis extends parallel to other horizontal directions perpendicular to the X-axis. The holding table 10 is movable along the X-axis by the X-axis moving unit 31. The holding table 10 is also rotatable by a rotary drive source, not illustrated, about a Z-axis indicated by a direction indicated by an arrow Z in FIG. 1. The Z-axis extends perpendicularly to the horizontal plane, i.e., the XY plane, and parallel to vertical directions perpendicular to the X-axis and the Y-axis.

The holding table 10 includes a plurality of (four in FIG. 1) clamp-like frame holders 12 disposed on an outer circumferential portion of the frame at angularly spaced intervals for holding and securing the annular frame 106 joined to the workpiece 100 on the holding table 10, at a position in which the upper surface of the annular frame 106 is lower, i.e., its height in the vertical directions is lower, than the holding surface 11.

Each of the first processing units 20 processes the workpiece 100 held on the holding table 10. According to the present embodiment, as illustrated in FIG. 1, the first processing unit 20 is a cutting unit for cutting the workpiece 100 held on the holding table 10, the cutting unit including a spindle with a cutting blade mounted on a distal end thereof. The first processing unit 20 is horizontally movable along the Y-axis perpendicular to the X-axis by the Y-axis moving unit 32 and is also vertically movable along the Z-axis by the Z-axis moving unit 33. The first processing unit 20 performs a cutting process on the workpiece 100 held on the holding table 10 when the spindle is rotated about its own axis to rotate the cutting blade on the distal end of the spindle about a horizontal axis parallel to the Y-axis, cutting the workpiece 100 along one of the projected dicing lines 102. As illustrated in FIG. 1, the workpiece processing apparatus 1 operates as a two-spindle dicing saw, i.e., a dual facing spindle cutting apparatus, with the two processing units, i.e., cutting units, 20.

Figure 2:
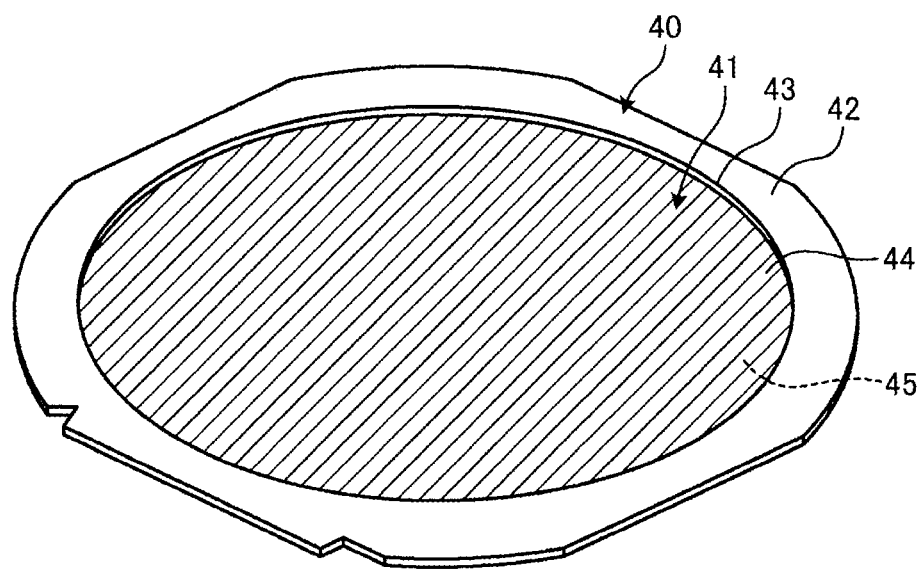
FIG. 2 is a perspective view illustrating a detailed structural example of a table cover as a component of the apparatus illustrated in FIG. 1.

FIG. 2 illustrates in perspective a detailed structural example of the table cover 40 as a component of the workpiece processing apparatus 1 illustrated in FIG. 1. According to the present embodiment, as illustrated in FIG. 2, the table cover 40 includes a sheet 41 and an annular frame 42. The annular frame 42 is of a shape similar to the annular frame 106 joined to the workpiece 100 and has a central opening 43. The sheet 41 is of a shape similar to the adhesive tape 105 and has an outer edge portion to which the annular frame 42 is affixed. The sheet 41 whose outer edge portion is affixed to the annular frame 42 extends beneath the central opening 43 of the annular frame 42, i.e., covers the central opening 43.

The delivery assembly 60 delivers the frame unit 110 through a delivery route in the workpiece processing apparatus 1. Since the table cover 40 including the sheet 41 affixed to the annular frame 42 is of a shape similar to the frame unit 110 including the adhesive tape 105 affixed to the annular frame 106 and supporting the workpiece 100, the table cover 40 can be handled by the delivery assembly 60 and delivered thereby through the delivery route in the workpiece processing apparatus 1, the delivery assembly 60 and the delivery route being shared with the frame unit 110, in the same manner as in the case of the frame unit 110.

Figure 3:
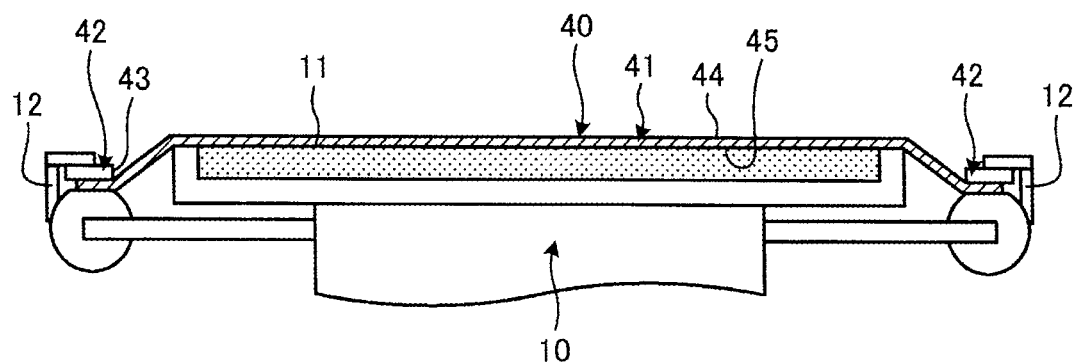
FIG. 3 is a cross-sectional view of the table cover illustrated in FIG. 2.

FIG. 3 illustrates in cross section the table cover 40 illustrated in FIG. 2. Since the table cover 40 is similar in shape to the frame unit 110, as described above, the table cover 40 can be held on the holding table 10 in the same manner as in the case of the frame unit 110. Specifically, as illustrated in FIG. 3, the sheet 41 of the table cover 40 is placed on the holding surface 11 of the holding table 10, and the annular frame 42 is held and secured by the frame holders 12. The table cover 40 may only be placed on the holding surface 11 or may be held under suction on the holding surface 11 in intimate contact therewith by the negative pressure from the vacuum suction source.

The sheet 41 of the table cover 40 has a contact surface to be held in contact with at least the holding surface 11. The contact surface of the sheet 41 is adhesive in nature. The adhesiveness of the contact surface is of such a degree that, when foreign matter such as swarf produced in processing cycles performed by the first processing unit 20 and the second processing unit 70 comes into contact with and adheres to the contact surface of the sheet 41, the contact surface keeps the foreign matter stuck more strongly than the surface of the adhesive tape 105 of the frame unit 110 at the time the workpiece 100 is processed by the first processing unit 20 and the second processing unit 70, and does not release the foreign matter even if the contact surface is inclined. As illustrated in FIG. 3, the contact surface of the sheet 41 that is held in contact with the holding surface 11 is indicated as a surface 45 that is opposite a surface 44 of the sheet 41 to which the annular frame 42 is affixed.

Consequently, the sheet 41 is also referred to as an adhesive sheet. According to the present embodiment, the sheet 41 includes a base layer and an adhesive glue layer disposed on a surface of the base layer. The base layer has a surface acting as the surface 44 of the sheet 41, whereas the glue layer has a surface acting as the surface 45 of the sheet 41, so that the surface 45 acts as the adhesive contact surface. The glue layer is made of adhesive synthetic resin and disposed on the surface of the base layer that is opposite the surface 44. The base layer is made of synthetic resin. The sheet 41 is not limited to the structure described above and may be free of the glue layer and include only a base layer made of an adhesive material. If the sheet 41 includes only a base layer made of an adhesive material, then the sheet 41 is in the form of a sheet mainly made of polyolefin, i.e., a polyolefin-base sheet, or specifically, a polyethylene sheet, a polypropylene sheet, a polystyrene sheet, or the like.

The cassette rest base 50 is a rest base for supporting thereon receptacles for housing frame units 110 and table covers 40 and is able to lift and lower receptacles placed thereon vertically along the Z-axis. According to the present embodiment, as illustrated in FIG. 1, the workpiece processing apparatus 1 includes a table cover receptacle 51 for housing a table cover 40 therein and a first cassette 52 as a receptacle for housing a plurality of frame units 110 therein. The table cover receptacle 51 is placed on the cassette rest base 50, and the first cassette 52 is placed on an upper surface of the table cover receptacle 51. The table cover receptacle 51 may house a plurality of table covers 40 therein. According to the present embodiment, the workpiece processing apparatus 1 includes a mechanism, not illustrated, for placing an inspection frame unit 110 into a removable second cassette, not illustrated, because it would require extra man-hours to remove the first cassette 52 and pull out a frame unit 110 from the first cassette 52 in order to inspect how the frame unit 110 has been cut by the first processing unit 20. According to the present embodiment, the second cassette may be used as the table cover receptacle 51, for example. However, the present invention is not limited to the above structural details including the table cover receptacle 51 and the first cassette 52. The workpiece processing apparatus 1 may be free of the table cover receptacle 51, and a table cover 40 may be housed in the first cassette 52 placed on the cassette rest base 50, the first cassette 52 being shared with frame units 110.

The delivery assembly 60 delivers frame units 110 between the first cassette 52 placed on the cassette rest base 50, the holding table 10, and a holding table 71 (see FIG. 4) of the second processing unit 70. The delivery assembly 60 also delivers a table cover 40 between the table cover receptacle 51 placed on the cassette rest base 50, the holding table 10, and the holding table 71 of the second processing unit 70. According to the present embodiment, as illustrated in FIG. 1, the delivery assembly 60 has a first delivery unit 61, a second delivery unit 62, and a pair of guide rails 63.

As illustrated in FIG. 1, the first delivery unit 61 is disposed in front of a loading/unloading portion, where a frame unit 110 with a workpiece 100 joined thereto can be loaded into and unloaded from the first cassette 52, of the first cassette 52 on the cassette rest base 50. The first delivery unit 61 is movable in loading and unloading directions along the Y-axis. The first delivery unit 61 operates as follows: The first delivery unit 61 holds a portion of the annular frame 106, that is closer to the loading/unloading portion of the first cassette 52, of the frame unit 110 in the first cassette 52, unloads the frame unit 110 out of the first cassette 52, and places and delivers the frame unit 110 onto and delivers the frame unit 110 along the guide rails 63 that are disposed in front of the loading/unloading portion of the first cassette 52 on the cassette rest base 50. The first delivery unit 61 also holds the annular frame 106 of a frame unit 110 with a workpiece 100 joined thereto on the guide rails 63 and delivers the frame unit 110 into the first cassette 52 along the Y-axis. Similarly, the first delivery unit 61 delivers a table cover 40 having a sheet 41 affixed to an annular frame 42, between the table cover receptacle 51 on the cassette rest base 50 and the guide rails 63.

As illustrated in FIG. 1, the second delivery unit 62 is movable along the Y-axis and the Z-axis between the guide rails 63, the holding table 10, and the second processing unit 70. The second delivery unit 62 holds onto an upper surface of a frame unit 110 downwardly along the Z-axis, holds the frame unit 110, and delivers the frame unit 110 between the guide rails 63, the holding table 10, and the second processing unit 70. Similarly, the second delivery unit 62 delivers a table cover 40 having a sheet 41 affixed to an annular frame 42, between the guide rails 63, the holding table 10, and the second processing unit 70.

Figure 4:
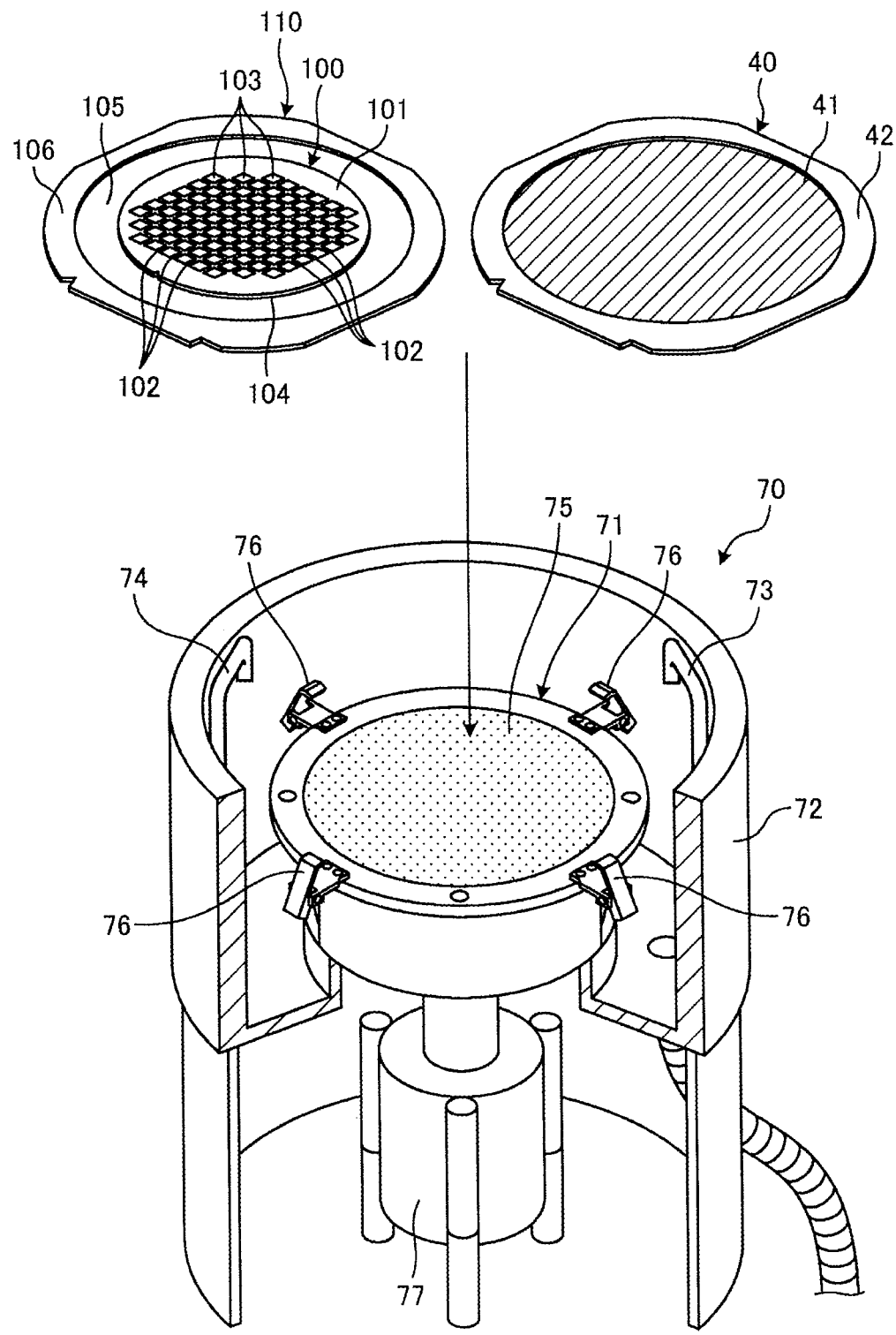
FIG. 4 is a perspective view illustrating a detailed structural example of a second processing unit of the apparatus illustrated in FIG. 1.

FIG. 4 illustrates in perspective a detailed structural example of the second processing unit 70 of the workpiece processing apparatus 1 illustrated in FIG. 1. As illustrated in FIG. 4, the second processing unit 70 is a cleaning unit for cleaning a frame unit 110 held on the holding table 71. The second processing unit 70 has the holding table 71, a cleaning liquid receptacle 72, a cleaning liquid supply nozzle 73, and an air supply nozzle 74.

According to the present embodiment, the holding table 71 is what is generally called a spinner table having a frame and a suction pad as with the holding table 10. An upper surface of the suction pad of the holding table 71 acts as a holding surface 75 for holding a workpiece 100 placed under suction thereon with the adhesive tape 105 interposed between the reverse side 104 of the workpiece 100 and the holding surface 75. According to the present embodiment, the porous portion of the suction pad of the holding table 71 is made of alumina ceramic, for example, as with the holding table 10. The suction pad, a vacuum suction source, and a vacuum suction channel that are combined with the holding table 71 make up a suction holding mechanism. The holding table 71 is movable vertically along the Z-axis by a plurality of air cylinders and is also rotatable about its vertical central axis along the Z-axis by an electric motor 77 connected to a lower portion of the holding table 71.

The holding table 71 includes a plurality of (four in FIG. 4) frame holders 76 disposed on an outer circumferential portion of the frame at angularly spaced intervals for holding and securing the annular frame 106 joined to a workpiece 100 on the holding table 71 under centrifugal forces generated upon rotation of the holding table 71.

The cleaning liquid receptacle 72 is disposed to cover an outer circumferential edge of the holding table 71, thereby housing the holding table 71 therein. The cleaning liquid receptacle 72 retrieves a cleaning liquid such as pure water scattered from the outer circumferential edge of the holding table 71 and introduces the retrieved cleaning liquid into a drain pipe. The cleaning liquid supply nozzle 73 supplies the cleaning liquid to the frame unit 110 held on the holding table 71. The air supply nozzle 74 supplies air to the frame unit 110 held on the holding table 71.

The second processing unit 70 performs a cleaning process on a frame unit 110 and a workpiece 100 supported thereon, by holding the workpiece 100 on the holding surface 75 of the holding table 71, rotating the holding table 71 to enable the frame holders 76 to hold the annular frame 106 joined to the workpiece 100, and supplying the cleaning liquid and air respectively from the cleaning liquid supply nozzle 73 and the air supply nozzle 74 to the workpiece 100 and the frame unit 110 on the holding table 71 to clean the workpiece 100 and the frame unit 110, thereby removing foreign matter deposited on the workpiece 100 and the frame unit 110.

Figure 5:
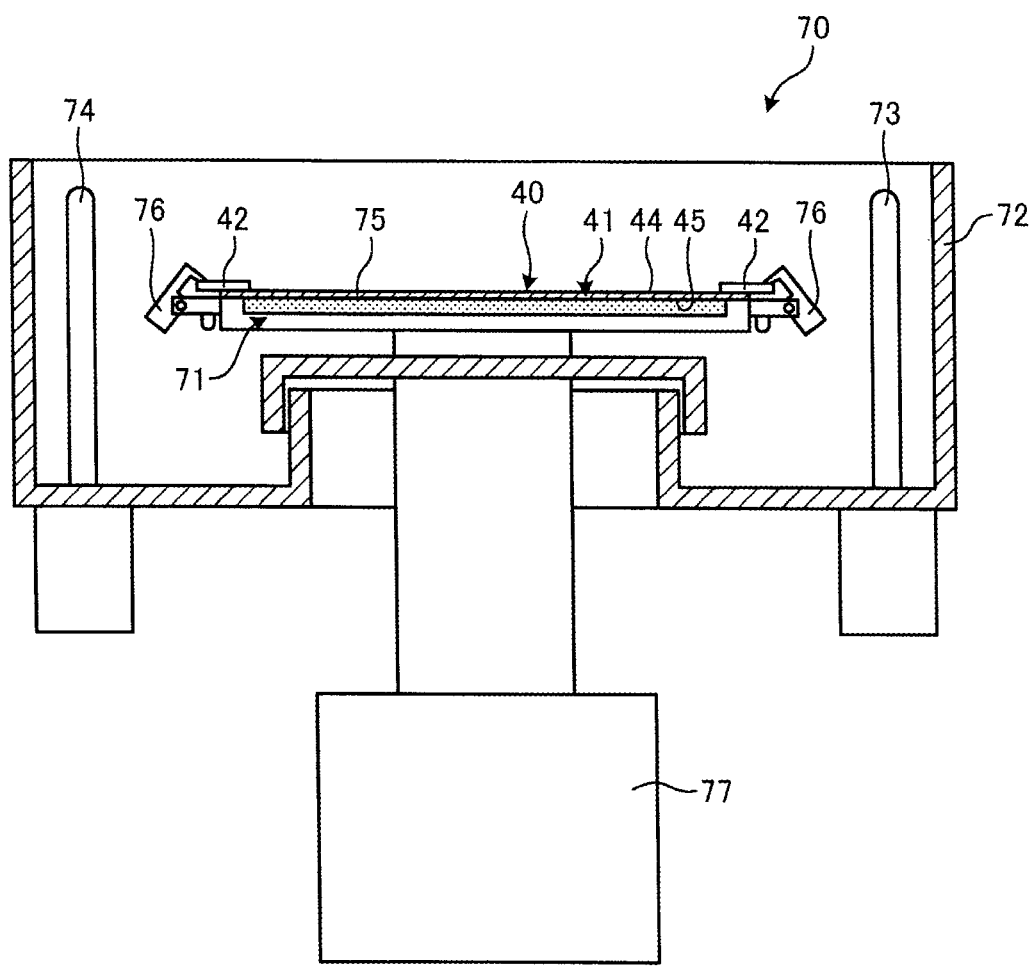
FIG. 5 is a cross-sectional view of the second processing unit illustrated in FIG. 4.

FIG. 5 illustrates in cross section the second processing unit 70 illustrated in FIG. 4. As illustrated in FIG. 5, the second processing unit 70 can hold and secure the table cover 40 including the sheet 41 affixed to the annular frame 42 to the holding table 71, in the same manner as in the case of the frame unit 110, by placing the sheet 41 on the holding surface 75 of the holding table 71 and holding the annular frame 42 with the frame holders 76. The table cover 40 may only be placed on the holding surface 75 or may be held under suction on the holding surface 75 with the sheet 41 held in intimate contact therewith by a negative pressure from the vacuum suction source.

The contact surface of the sheet 41 that is to be held against at least the holding surface 75 is adhesive in nature. The adhesive contact surface of the sheet 41 and the adhesiveness thereof are the same as those of the contact surface of the sheet 41 that is to be held against the holding surface 11 as described above. Stated otherwise, the adhesive contact surface of the sheet 41 and the adhesiveness thereof remain unchanged regardless of whether the table cover 40 contacts the holding surface 11 or the holding surface 75.

The controller 80 controls operation of various components of the workpiece processing apparatus 1 to enable the workpiece processing apparatus 1 to perform various processes on the frame unit 110 and the table cover 40, the various processes including the workpiece processing method according to the present embodiment. The controller 80 can determine whether or not the frame unit 110 is held on the holding surfaces 11 and 75, on the basis of signals from sensors combined with the suction holding mechanisms of the holding tables 10 and 71. According to the present embodiment, the controller 80 includes a computer system. The computer system included in the controller 80 has a processing device having a microprocessor such as a central processing unit (CPU), a storage device having a memory such as a read only memory (ROM) or a random access memory (RAN), and an input/output interface device. The processing device carries out processing processes according to computer programs stored in the storage device and generates and outputs control signals for controlling the workpiece processing apparatus 1 to the various components of the workpiece processing apparatus 1 through the input/output interface device.

Figure 6:
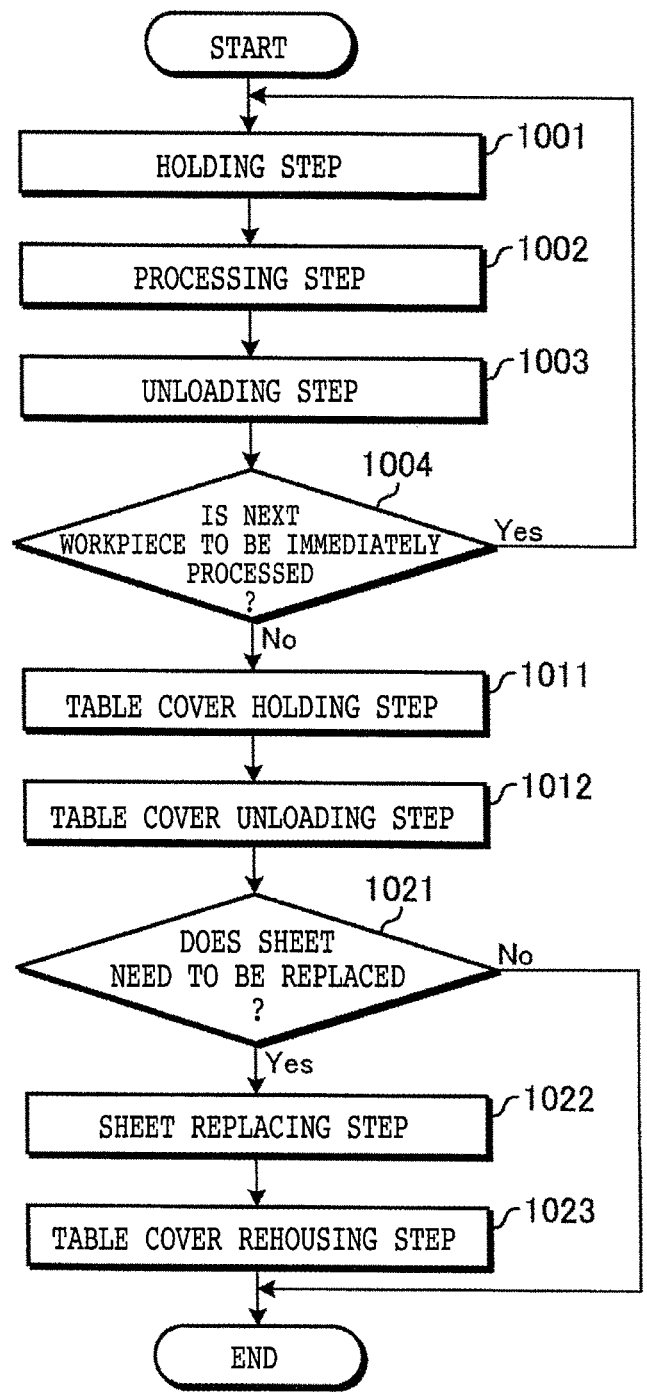
FIG. 6 is a flowchart illustrating a processing sequence of a method of processing a workpiece according to the embodiment.

FIG. 6 is a flowchart of a processing sequence of the workpiece processing method according to the present embodiment. The workpiece processing method according to the present embodiment represents an example of an operation sequence carried out mainly under the control of the controller 80 by the workpiece processing apparatus 1. As illustrated in FIG. 6, the workpiece processing method includes a holding step 1001, a processing step 1002, an unloading step 1003, a workpiece processing decision step 1004, a table cover holding step 1011, a table cover unloading step 1012, a sheet replacement decision step 1021, a sheet replacing step 1022, and a table cover rehousing step 1023.

The holding step 1001, the processing step 1002, and the unloading step 1003 are steps with regard to the processing of the workpiece 100. The table cover holding step 1011 and the table cover unloading step 1012 are steps with regard to the holding and removing of the table cover 40. The sheet replacing step 1022 and the table cover rehousing step 1023 are steps with regard to the replacement of the sheet 41 of the table cover 40.

According to the present embodiment, since the workpiece processing apparatus 1 has two processing units including the first processing unit 20, i.e., the cutting unit, and the second processing unit 70, i.e., the cleaning unit, the workpiece processing method includes a first holding step 1001, a first processing step 1002, and a first unloading step 1003 in connection with the cutting process performed by the first processing unit 20 and a second holding step 1001, a second processing step 1002, and a second unloading step 1003 in connection with the cleaning process performed by the second processing unit 70. The kinds of holding step 1001, processing step 1002, and unloading step 1003 and the number of times that these steps are performed are variable depending, for example, on the kinds of processing units incorporated in the workpiece processing apparatus 1 and the number of times that each workpiece 100 is to be processed.

The first holding step 1001 is a step of the delivery assembly 60 delivering a frame unit 110 with a workpiece 100 supported thereon from the first cassette 52 to the holding table 10 and holding the workpiece 100 on the holding surface 11 of the holding table 10. Specifically, in the first holding step 1001, according to the present embodiment, the first delivery unit 61 delivers the frame unit 110 with the workpiece 100 to be processed, from the first cassette 52 onto the guide rails 63, and then the second delivery unit 62 delivers the frame unit 110 from the guide rails 63 onto the holding table 10 where the holding surface 11 holds the workpiece 100 thereon and the frame holders 12 hold the annular frame 106 joined to the workpiece 100.

The first processing step 1002 is a step of the first processing unit 20 processing the workpiece 100 held on the holding surface 11 of the holding table 10. Specifically, in the first processing step 1002, according to the present embodiment, the first processing unit 20 as the cutting unit cuts the workpiece 100 along a projected dicing line 102 thereon by moving the cutting blade along the projected dicing line 102 relatively to the workpiece 100 held on the holding table 10 while rotating the spindle about its central axis with the rotating spindle.

The first unloading step 1003 is a step of unloading the frame unit 110 with the workpiece 100 cut in the first processing step 1002 from the holding surface 11 of the holding table 10. Specifically, in the first unloading step 1003, according to the present embodiment, the holding surface 11 of the holding table 10 releases the processed workpiece 100, the frame holders 12 release the annular frame 106 joined to the workpiece 100, and then the second delivery unit 62 delivers the frame unit 110 from the holding surface 11 of the holding table 10 to the holding table 71 of the second processing unit 70.

The second holding step 1001 is a step of holding the workpiece 100 joined to the frame unit 110 on the holding surface 75 of the holding table 71 of the second processing unit 70 after the frame unit 110 that has been unloaded from the first cassette 52 by the first delivery unit 61 and cut by the first processing unit 20 is delivered to the holding table 71. According to the present embodiment, the second holding step 1001 is carried out subsequently to the first unloading step 1003. Specifically, in the second holding step 1001, the holding surface 75 of the holding table 71 holds thereon the cut workpiece 100 that has been delivered in the first unloading step 1003 from the holding surface 11 of the holding table 10 to the holding table 71 of the second processing unit 70 by the second delivery unit 62, and the holding table 71 is rotated about its central axis to enable the frame holders 76 to hold the annular frame 106 joined to the workpiece 100.

The second processing step 1002 is a step of the second processing unit 70 to clean the workpiece 100 held on the holding surface 75 of the holding table 71. Specifically, in the second processing step 1002, the cleaning liquid supply nozzle 73 and the air supply nozzle 74 supply a cleaning liquid and air, respectively, to the workpiece 100 on the holding table 71 that is being rotated, to clean the workpiece 100 and the frame unit 110, thereby removing foreign matter deposited on the workpiece 100 and the frame unit 110.

The second unloading step 1003 is a step of unloading the workpiece 100 that has been cleaned in the second processing step 1002 from the holding surface 75 of the holding table 71. Specifically, in the second unloading step 1003, according to the present embodiment, after the cleaning process in the second processing step 1002 has been carried out, the holding table 71 stops rotating to cause the frame holders 76 to release the annular frame 106 joined to the workpiece 100, the holding surface 75 of the holding table 71 releases the workpiece 100, the second delivery unit 62 delivers the frame unit 110 from the holding table 71 onto the guide rails 63, and the first delivery unit 61 delivers the frame unit 110 from the guide rails 63 to the first cassette 52.

According to the present embodiment, in this manner, the first holding step 1001, the first processing step 1002, and the first unloading step 1003 are carried out to perform the cutting process on a single workpiece 100, after which the second holding step 1001, the second processing step 1002, and the second unloading step 1003 are carried out to perform the cleaning process of the single workpiece 100 that has been cut.

In the workpiece processing method according to the present embodiment, after the first holding step 1001, the first processing step 1002, the first unloading step 1003, the second holding step 1001, the second processing step 1002, and the second unloading step 1003 have been carried out on a single workpiece 100 on a frame unit 110, if a workpiece 100 on a next frame unit 110 is to be immediately processed in the cutting process and the cleaning process (Yes in the step 1004 in FIG. 6), then the first holding step 1001, the first processing step 1002, the first unloading step 1003, the second holding step 1001, the second processing step 1002, and the second unloading step 1003 are carried out on the workpiece 100 on the next frame unit 110 in the same manner as described above. These steps are repeatedly carried out on successive workpieces 100 on respective frame units 110 until the processing on a workpiece 100 on a next frame unit 110 is not to be carried out in the cutting process and the cleaning process (No in the step 1004 in FIG. 6). If the processing on a workpiece 100 on a next frame unit 110 has not been carried out for a predetermined period of time (No in the step 1004 in FIG. 6), then the processing sequence goes to the table cover holding step 1011.

A workpiece 100 on a next frame unit 110 is determined not to be immediately processed in the cutting process and the cleaning process (No in the step 1004 in FIG. 6) when the processing of all frame units 110 to be processed that are stored in the first cassette 52 has been completed, when predetermined tasks registered in advance in the controller 80, such as maintenance work, cutting blade replacement, and an idling process for actuating the first processing unit 20 and the second processing unit 70 while supplying processing fluids until the temperature of processing chambers or spaces becomes stabilized, are performed, when the controller 80 determines that holding of a frame unit 110 on the holding surfaces 11 and 75 of the holding tables 10 and 71 has not been carried out for a preset period of time, or when the workpiece processing apparatus 1 is turned off, for example.

When a workpiece 100 on a next frame unit 110 is not to be immediately processed (No in the step 1004 in FIG. 6), the period of time that elapses from the first unloading step 1003 carried out on a frame unit 110 until the first holding step 1001 carried out on a next frame unit 110 is longer than when a workpiece 100 on a next frame unit 110 is to be immediately processed (Yes in the step 1004 in FIG. 6), resulting in an increase in the period of time in which no workpiece 100 is held on the holding surface 11 of the holding table 10. In addition, the period of time that elapses from the second unloading step 1003 carried out on a frame unit 110 until the second holding step 1001 carried out on a next frame unit 110 also becomes longer, resulting in an increase in the period of time in which no workpiece 100 is held on the holding surface 75 of the holding table 71 of the second processing unit 70.

The table cover holding step 1011 is a step of holding a table cover 40 on the holding surfaces 11 and 75 of the holding tables 10 and 71 to prevent foreign matter from being deposited on the holding surfaces 11 and 75 at the time no workpiece 100 is held on the holding surfaces 11 and 75. Specifically, according to the present embodiment, the table cover holding step 1011 is carried out if a workpiece 100 on a next frame unit 110 is not immediately processed (No in the step 1004 in FIG. 6) upon elapse of a standby time set in a standby time storage area in the storage device of the workpiece processing apparatus 1.

In the table cover holding step 1011, according to the present embodiment, the delivery assembly 60 delivers the table cover 40 from the table cover receptacle 51 to the holding table 10 where the holding surface 11 and the frame holders 12 hold the table cover 40, as with the first holding step 1001, and the delivery assembly 60 delivers the table cover 40 from the table cover receptacle 51 to the holding table 71 of the second processing unit 70 where the holding surface 75 and the frame holders 76 hold the table cover 40, as with the second holding step 1001. In this fashion, the table cover 40 held on the holding surfaces 11 and 75 prevents foreign matter from being deposited on the holding surfaces 11 and 75. Further, according to the present embodiment, since the contact surface 45 of the table cover 40 that contacts at least the holding surfaces 11 and 75 is adhesive, foreign matter that may be present on the holding surfaces 11 and 75 adheres to the contact surface 45 in the table cover holding step 1011. The table cover holding step 1011 may be carried out on either one of the holding surfaces 11 and 75.

The present invention is not limited to the above details of the table cover holding step 1011. If a next workpiece 100 is not processed immediately after the workpiece processing apparatus 1 has been turned off, for example, an operator of the workpiece processing apparatus 1 may operate the workpiece processing apparatus 1 to cause the delivery assembly 60 to take a table cover 40 from the table cover receptacle 51 and place the table cover 40 on the holding tables 10 and 71 where the table cover 40 is placed on the holding surfaces 11 and 75, or alternatively, the operator may manually take a table cover 40 from the table cover receptacle 51 and place the table cover 40 on the holding tables 10 and 71 where the table cover 40 is placed on the holding surfaces 11 and 75.

The table cover unloading step 1012 is a step of releasing the table cover 40 held in the table cover holding step 1011 on the holding tables 10 and 71 from the holding surfaces 11 and 75 and the frame holders 12 and 76, as with the first unloading step 1003 and the second unloading step 1003, and then holding the table cover 40 with the delivery assembly 60 and spacing the table cover 40 away from the holding surfaces 11 and 75. According to the present embodiment, inasmuch as the contact surface 45 of the table cover 40 that contacts at least the holding surfaces 11 and 75 is adhesive, foreign matter that may be present on the holding surfaces 11 and 75 may be removed from the holding surfaces 11 and 75 when the contact surface 45 is peeled off from the holding surfaces 11 and 75.

The table cover unloading step 1012 is carried out when mainly the holding surfaces 11 and 75 need to hold nothing thereon after the table cover holding step 1011 has been carried out. The holding surfaces 11 and 75 need to hold nothing thereon when a workpiece 100 should immediately be processed on the holding surfaces 11 and 75, when the holding tables 10 and 71 are to be replaced with new ones, when the holding surfaces 11 and 75 of the holding tables 10 and 71 are to be cleaned, or when maintenance work such as a process of measuring the heights of the holding surfaces 11 and 75 is performed, for example.

The table cover unloading step 1012 may further include unloading the table cover 40 from the holding surfaces 11 and 75 and delivering the table cover 40 to the table cover receptacle 51 with use of the delivery assembly 60, as with the first unloading step 1003 and the second unloading step 1003.

In the workpiece processing method according to the present embodiment, after the table cover unloading step 1012 has been carried out, if the sheet 41 of the table cover 40 needs to be replaced (Yes in the step 1021 in FIG. 6), then the sheet replacing step 1022 and the table cover rehousing step 1023 are carried out, and if the sheet 41 of the table cover 40 does not need to be replaced (No in the step 1021 in FIG. 6), then the sheet replacing step 1022 and the table cover rehousing step 1023 are not carried out, and the processing sequence of the workpiece processing method comes to an end.

Whether or not the sheet 41 of the table cover 40 needs to be replaced can be determined by deciding whether or not the sheet 41 is damaged, for example. Alternatively, providing the sheet 41 is not damaged, whether or not the sheet 41 of the table cover 40 needs to be replaced may be determined by deciding whether or not the amount of foreign matter removed by the adhesive contact surface 45 of the sheet 41 exceeds a preset amount. Whether or not the amount of foreign matter removed by the adhesive contact surface 45 of the sheet 41 exceeds a preset amount may be determined by deciding whether or not the number of times that the table cover holding step 1011 and the table cover unloading step 1012 have been carried out exceeds a preset number of times, or whether or not the number of times that workpieces 100 have been processed prior to the table cover holding step 1011 and the table cover unloading step 1012 exceeds a preset number of times, for example.

The sheet replacing step 1022 is a step of replacing the sheet 41 of the table cover 40. In the sheet replacing step 1022, a given extracting apparatus or the operator of the workpiece processing apparatus 1 takes out a table cover 40 whose sheet 41 is to be replaced from the table cover receptacle 51, and a given sheet replacing apparatus or the operator of the workpiece processing apparatus 1 peels off the sheet 41 from the annular frame 42 of the table cover 40 and affixes a new sheet 41 to the annular frame 42, thereby replacing the sheet 41 of the table cover 40.

The table cover rehousing step 1023 is a step of housing the table cover 40 with the new sheet 41 affixed in the sheet replacing step 1022, in the table cover receptacle 51 again. In the table cover rehousing step 1023, a given housing apparatus or the operator of the workpiece processing apparatus 1 returns the table cover 40 with the new sheet 41 into the table cover receptacle 51.

With the workpiece processing apparatus 1 and the workpiece processing method according to the above embodiment, since the holding surfaces 11 and 75 are covered with the table cover 40 at the time no workpiece 100 is held on the holding surfaces 11 and 75, the holding surfaces 11 and 75 are not left exposed, so that foreign matter is prevented from being deposited on the holding surfaces 11 and 75. Further, as the contact surface of the sheet 41 of the table cover 40 that contacts at least the holding surfaces 11 and 75 is adhesive, foreign matter that may be deposited on the holding surfaces 11 and 75 adheres to the adhesive contact surface of the sheet 41 when the sheet 41 is held on the holding surfaces 11 and 75, and can be removed from the holding surfaces 11 and 75 when the contact surface 45 is peeled off from the holding surfaces 11 and 75.

Moreover, the table cover 40 includes the sheet 41 affixed to the annular frame 42 having the central opening 43, and the sheet 41 has the adhesive contact surface 45 that is opposite the surface 44 thereof to which the annular frame 42 is affixed. Therefore, a new table cover 40 can easily be reconstructed from the table cover 40 by replacing the sheet 41, which has removed foreign matter by adhering thereto, with a new one.

In addition, at least an outer edge of the table cover 40 is of a shape similar to an outer edge of the frame unit 110 including the annular frame 106 that is joined to the workpiece 100 by the adhesive tape 105. Therefore, the table cover 40 can be delivered by the delivery assembly 60 through the delivery route in the workpiece processing apparatus 1, the delivery assembly 60 and the delivery route being shared with the frame unit 110. As the delivery assembly 60 can be used to deliver the table cover 40 and there is no need for a dedicated delivery unit for the delivery of the table cover 40 in the workpiece processing apparatus 1, the workpiece processing apparatus 1 is restrained from increasing in size and cost for using the table cover 40.

Further, since table covers 40 are housed in the table cover receptacle 51 separate from the first cassette 52 that stores frame units 110, the workpieces 100 supported on the frame units 110 housed in the first cassette 52 do not run the risk of being contaminated by the foreign matter that has been removed from the holding surfaces 11 and 75 and adhered to the table cover 40.

According to the present embodiment, in addition to the adhesive contact surface 45 of the sheet 41 of the table cover 40 that contacts the holding surfaces 11 and 75, the surface 44 of the sheet 41 to which the annular frame 42 is affixed may also be adhesive in nature. As foreign matter that may be deposited on the adhesive surface 44 of the sheet 41 adheres to the adhesive surface 44 and is prevented from falling off while the table cover 40 is being delivered in the workpiece processing apparatus 1, the foreign matter is prevented from contaminating various parts of the workpiece processing apparatus 1 and can reliably be removed. Moreover, other contact surfaces of the table cover 40 that contact the delivery assembly 60, i.e., the first delivery unit 61, the second delivery unit 62, and the guide rails 63, may also be adhesive in nature. Those adhesive contact surfaces of the table cover 40 are able to remove foreign matter that may be deposited on the delivery assembly 60. According to the present embodiment, the contact surfaces of the table cover 40 that contact the delivery assembly 60 include upper surface portions of the annular frame 42, and may be made adhesive by the sheet 41 that is affixed to the upper surface of the annular frame 42 and the lower surface of the annular frame 42, for example.

First Modification

Figure 7:
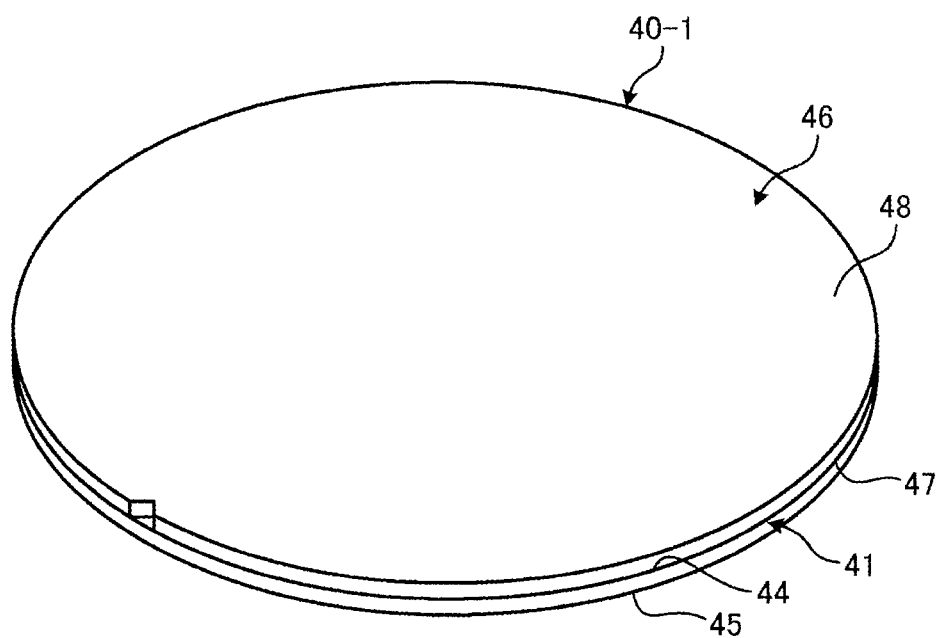
FIG. 7 is a perspective view illustrating a detailed structural example of a table cover as a component of an apparatus for processing a workpiece according to a first modification of the embodiment.
Figure 8:
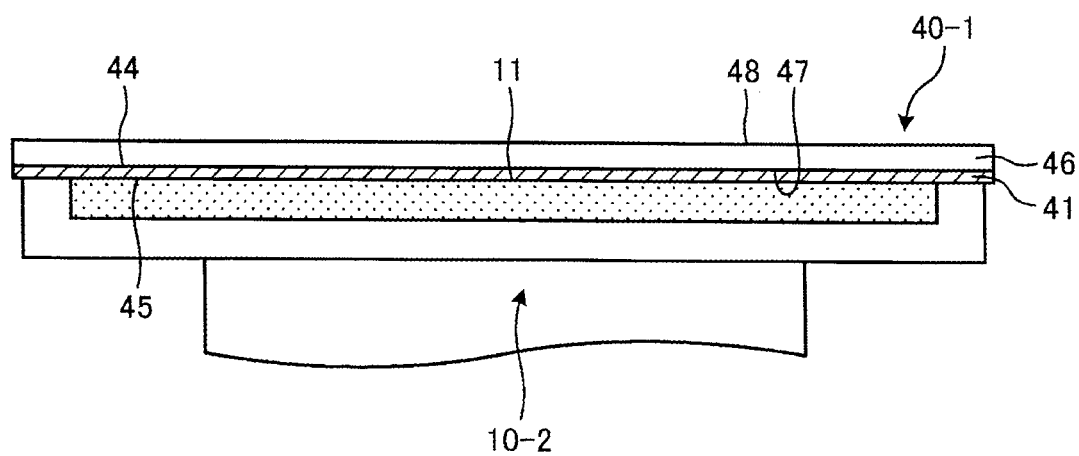
FIG. 8 is a cross-sectional view of the table cover illustrated in FIG. 7.

A workpiece processing apparatus 1 and a workpiece processing method according to a first modification of the embodiment will be described below with reference to FIGS. 7 and 8. FIG. 7 illustrates in perspective a detailed structural example of a table cover 40-1 as a component of the workpiece processing apparatus 1 according to the first modification. FIG. 8 illustrates in cross section the table cover 40-1 illustrated in FIG. 7. Those parts illustrated in FIGS. 7 and 8 that are identical to those according to the embodiment are denoted by identical reference characters and will not be described in detail below.

According to the first modification, as illustrated in FIGS. 7 and 8, the table cover 40 according to the embodiment is changed to the table cover 40-1, the holding table 10 is changed to a holding table 10-2 that is free of the frame holders 12, and the holding table 71 of the second processing unit 70 is changed to a holding table that is free of the frame holders 76. Because of these changes, the workpiece 100 to be processed according to the embodiment is changed to a workpiece having a reverse side 104 to which an adhesive tape 105 similar in shape to the workpiece 100 is affixed, with no annular frame 106 affixed to the adhesive tape 105. Further, the delivery assembly 60 according to the embodiment is changed to a delivery assembly arranged for holding a portion of the workpiece 100 or the adhesive tape 105 in order to deliver the workpiece 100, rather than holding a portion of the annular frame 106. Because of the changes, moreover, the holding step 1001 and the table cover holding step 1011 are changed to steps that are free of the frame holders 12 and 76 holding the annular frames 106 and 42. Other details of the first modification are similar to those according to the embodiment.

As illustrated in FIG. 7, the table cover 40-1 includes a sheet 41 and a plate-shaped member 46. According to the first modification, the plate-shaped member 46 is of a shape similar to that of the workpiece 100 according to the embodiment. The sheet 41 is of a shape similar to that of the adhesive tape 105 affixed to the workpiece 100, and is affixed to a surface 47 of the plate-shaped member 46. The plate-shaped member 46 has another surface 48 that is opposite the surface 47 and that is exposed away from the sheet 41. A contact surface of the sheet 41 that contacts at least the holding surfaces 11 and 75 is adhesive in nature. According to the first modification, as illustrated in FIG. 8, the contact surface of the sheet 41 that is held in contact with the holding surfaces 11 and 75 is indicated as a surface 45 that is opposite a surface 44 of the sheet 41 to which the plate-shaped member 46 is affixed. The plate-shaped member 46 is, for example, a dummy wafer that is made of the same material as the workpiece 100 and that is free of the projected dicing lines 102 and the devices 103.

Inasmuch as the table cover 40-1 including the plate-shaped member 46 with the sheet 41 affixed thereto is shaped similarly to the workpiece 100 to which the adhesive tape 105 is affixed, and since the delivery assembly 60 according to the first modification is arranged to hold a portion of the workpiece 100 or the sheet 41 in order to deliver the workpiece 100, the table cover 40-1 can be handled by the delivery assembly 60 and delivered thereby through the delivery route in the workpiece processing apparatus 1 according to the first modification, the delivery assembly 60 and the delivery route being shared with the workpiece 100 to which the adhesive tape 105 is affixed, in the same manner as in the case of the workpiece 100 according to the embodiment.

Moreover, the table cover 40-1 including the plate-shaped member 46 with the sheet 41 affixed thereto can be held under suction on the holding table 10 with the sheet 41 placed on the holding surface 11, in the same manner as in the case of the workpiece 100 to which the adhesive tape 105 is affixed, as illustrated in FIG. 8. Although not illustrated, the table cover 40-1 can also be held under suction on the holding surface 75 of the holding table 71.

The workpiece processing apparatus 1 and the workpiece processing method according to the first modification are essentially the same as those according to the embodiment except for the workpiece 100, the table cover 40, and the parts of the holding tables 10 and 71 that act on the annular frames 106 and 42, and operate in the same manner as and offer the same advantages as the workpiece processing apparatus 1 and the workpiece processing method according to the embodiment.

According to the first modification, further, the plate-shaped member 46 is shaped similarly to the workpiece 100 to be processed according to the embodiment, and the sheet 41 shaped similarly to the adhesive tape 105 that is affixed to the workpiece 100, so that the table cover 40-1 is shaped similarly to the workpiece 100. The delivery assembly 60 according to the first modification is arranged to hold a portion of the workpiece 100 or the sheet 41 in order to deliver the workpiece 100, as described above. Consequently, the table cover 40-1 can be handled by the delivery assembly 60 and delivered thereby through the delivery route in the workpiece processing apparatus 1 according to the first modification, the delivery assembly 60 and the delivery route being shared with the workpiece 100 to which the adhesive tape 105 is affixed, in the same manner as in the case of the workpiece 100 according to the embodiment. As the delivery assembly 60 can be used to deliver the table cover 40-1 and there is no need for a dedicated delivery unit for the delivery of the table cover 40-1 in the workpiece processing apparatus 1, the workpiece processing apparatus 1 is restrained from increasing in size and cost for using the table cover 40-1.

Second Modification

Figure 9:
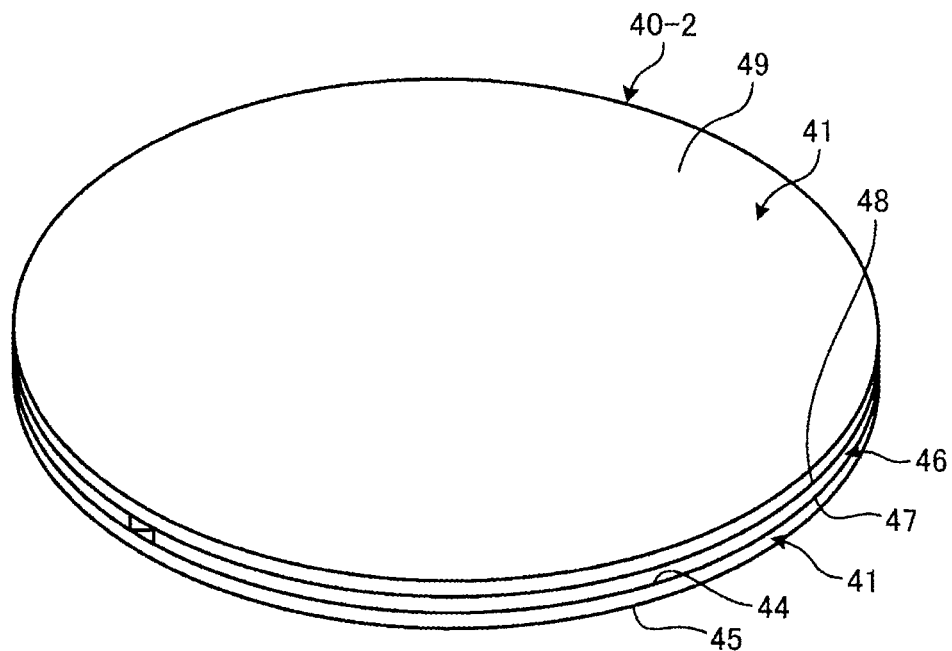
FIG. 9 is a perspective view illustrating a detailed structural example of a table cover as a component of an apparatus for processing a workpiece according to a second modification of the embodiment.
Figure 10:
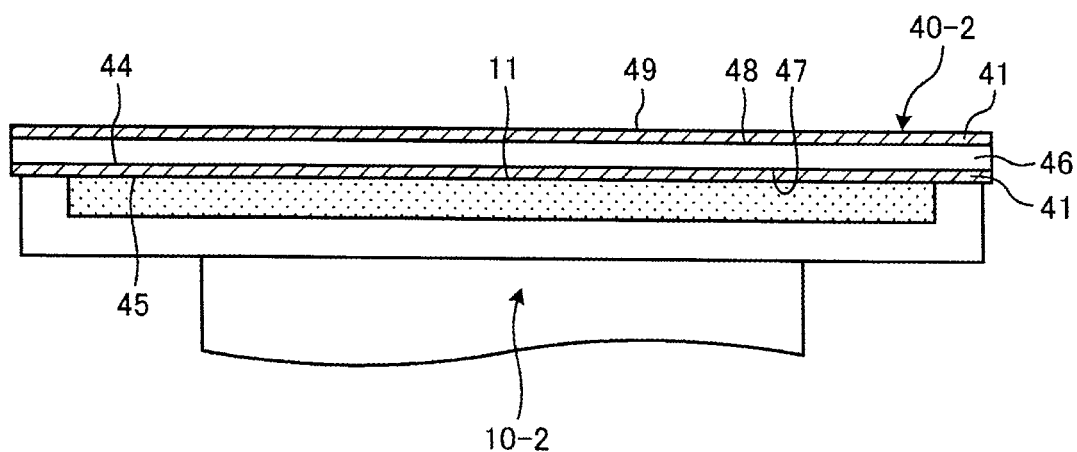
FIG. 10 is a cross-sectional view of the table cover illustrated in FIG. 9.

A workpiece processing apparatus 1 and a workpiece processing method according to a second modification of the embodiment will be described below with reference to FIGS. 9 and 10. FIG. 9 illustrates in perspective a detailed structural example of a table cover 40-2 as a component of the workpiece processing apparatus 1 according to the second modification. FIG. 10 illustrates in cross section the table cover 40-2 illustrated in FIG. 9. Those parts illustrated in FIGS. 9 and 10 that are identical to those according to the embodiment and the first modification are denoted by identical reference characters and will not be described in detail below.

According to the second modification, as illustrated in FIGS. 9 and 10, the table cover 40-1 according to the first modification is changed to the table cover 40-2. Other details of the second modification are similar to those according to the first modification. The table cover 40-2 includes the sheet 41, the plate-shaped member 46, and another sheet 41 affixed to the other surface 48 of the plate-shaped member 46. Specifically, the other sheet 41 has a surface affixed to the other surface 48 of the plate-shaped member 46 and another surface 49 that is opposite the surface thereof affixed to the plate-shaped member 46 and that is adhesive in nature.

According to the second modification, the table cover 40-1 according to the first modification is changed to the table cover 40-2 with the other sheet 41 affixed to the other surface 48 of the plate-shaped member 46. Therefore, the workpiece processing apparatus 1 and the workpiece processing method according to the second modification operate in the same manner as and offer the same advantages as the workpiece processing apparatus 1 and the workpiece processing method according to the embodiment. According to the second modification, further, the table cover 40-2 is able to remove also foreign matter deposited on the delivery assembly 60, with use of the adhesiveness of the adhesive surface 49 of the sheet 41 affixed to the other surface 48 of the plate-shaped member 46. In addition, since the delivery assembly 60 is capable of delivering the table cover 40-2 through the delivery route in the workpiece processing apparatus 1 in the same manner as in the case of the table cover 40-1 according to the first modification, there is no need for a dedicated delivery unit for the delivery of the table cover 40-2 in the workpiece processing apparatus 1, so that the workpiece processing apparatus 1 is restrained from increasing in size and cost for using the table cover 40-2.

Third Modification

Figure 11:
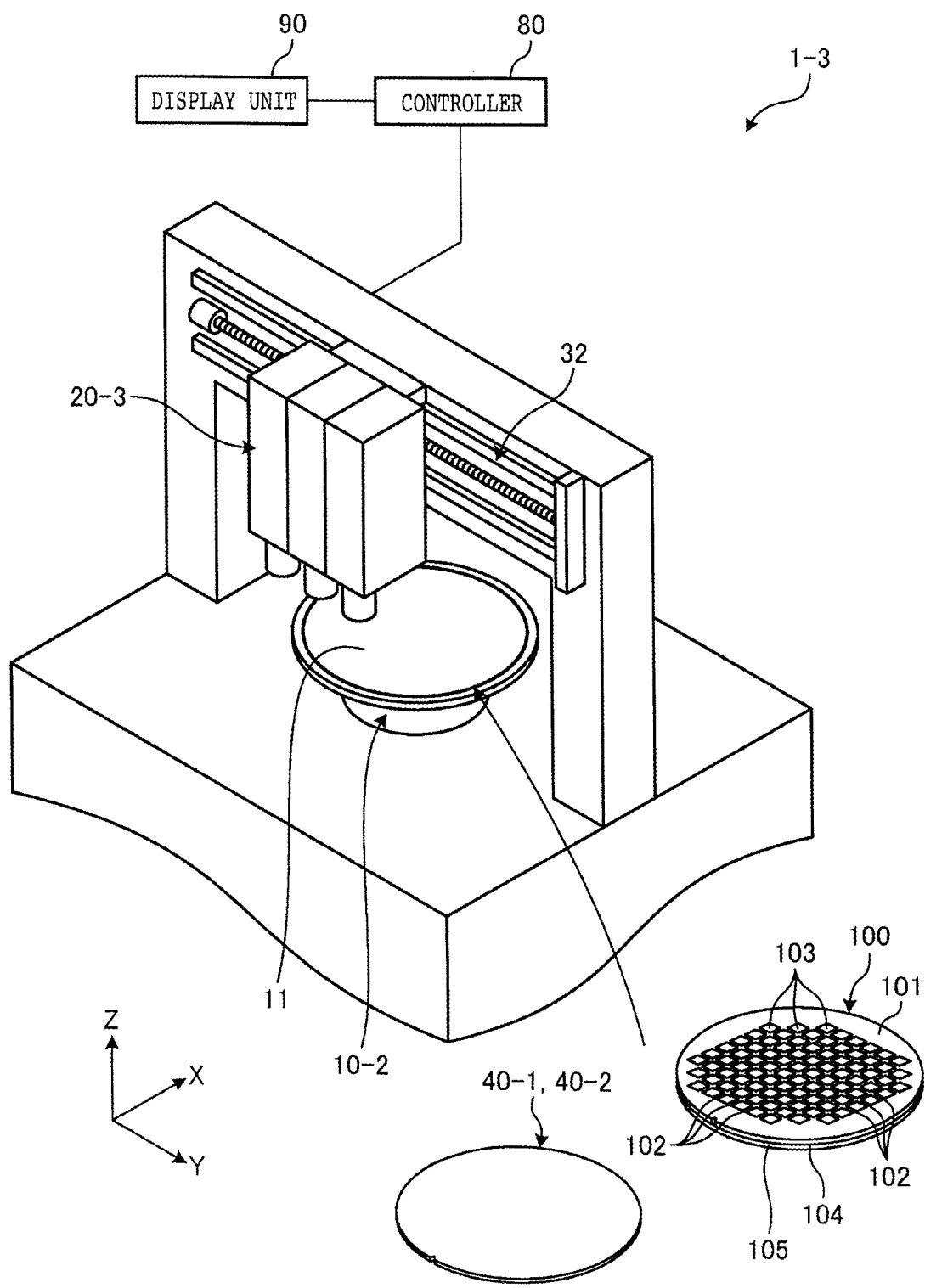
FIG. 11 is a perspective view, partly in block form, illustrating a structural example of an apparatus for processing a workpiece according to a third modification of the embodiment.

A workpiece processing apparatus 1-3 and a workpiece processing method according to a third modification of the embodiment will be described below with reference to FIG. 11. FIG. 11 illustrates in perspective a structural example of the workpiece processing apparatus 1-3 according to the third modification. Those parts illustrated in FIG. 11 that are identical to those according to the embodiment, the first modification, and the second modification are denoted by identical reference characters and will not be described in detail below.

As illustrated in FIG. 11, the workpiece processing apparatus 1-3 according to the third modification includes a holding table 10-2, a third processing unit 20-3, a Y-axis moving unit 32, table covers 40-1 and 40-2, a controller 80, and a display unit 90. Although not illustrated in FIG. 11, the workpiece processing apparatus 1-3 further includes a cassette rest base and a delivery assembly that are identical to the cassette rest base 50 and the delivery assembly 60 according to the embodiment. The workpiece processing apparatus 1-3 processes the workpiece 100 with the adhesive tape 105 affixed thereto, and also uses the table covers 40-1 and 40-2 as appropriate, as with the first modification and the second modification.

The third processing unit 20-3 processes the workpiece 100 held on the holding table 10-2. Specifically, the third processing unit 20-3 functions as an inspection unit for inspecting the workpiece 100 held on the holding table 10-2. The third processing unit 20-3 includes an appropriate combination of one or more (three in FIG. 11) of, for example, a bright-field image capturing unit for capturing an image of the face side 101 of the workpiece 100 according to a bright-field observation process to acquire inspection information of the workpiece 100, a dark-field image capturing unit for capturing an image of the face side 101 of the workpiece 100 according to a dark-field observation process to acquire inspection information of the workpiece 100, a surface inspection unit for detecting light dispersed by the face side 101 of the workpiece 100 to acquire inspection information of the workpiece 100, and a thickness measuring unit for measuring the height of the face side 101 from the reverse side 104 of the workpiece 100 to acquire inspection information of the workpiece 100. The third processing unit 20-3 inspects, for example, machined grooves formed in the workpiece 100 by a cutting process or a laser applying process, chipped regions of the workpiece 100, or the surface roughness of a surface that has been ground. According to the third modification, the controller 80 performs an analyzing process for inspection, such as an image processing process, on the basis of the inspection information acquired by the third processing unit 20-3.

The display unit 90 is mounted on a cover, not illustrated, of the workpiece processing apparatus 1-3 and has a display screen facing outwardly. The display unit 90 displays, on the display screen, images for setting inspecting conditions and the like for the various units of the third processing unit 20-3 and captured images and inspection results from the third processing unit 20-3, for the operator of the workpiece processing apparatus 1-3 to see. The display unit 90 includes a liquid crystal display device or the like. The display unit 90 also includes an input unit to be used by the operator to enter information with regard to inspecting conditions and the like for the various units of the third processing unit 20-3, information with regard to the display of captured images and inspection results, and the like. The input unit included in the display unit 90 includes at least one of a touch panel on the display unit 90, a keyboard, or the like. The display unit 90 may not fixedly be mounted on the workpiece processing apparatus 1-3 but may be provided on desired communication equipment that is connected to the workpiece processing apparatus 1-3 through a wireless or wired communication link.

The workpiece processing apparatus 1-3 and the workpiece processing method according to the third modification are essentially the same as those according to the first and second modifications except for the third processing unit 20-3 that performs an inspection process that is used instead of the first processing unit 20 for performing the cutting process and the second processing unit 70 for performing the cleaning process according to the embodiment. The workpiece processing apparatus 1-3 and the workpiece processing method according to the third modification thus operate in the same manner as and offer the same advantages as the workpiece processing apparatus 1 and the workpiece processing method according to the first and second modifications. The third modification may further be modified such that the workpiece 100 is supported on the frame unit 110 including the annular frame 106 affixed to the adhesive tape 105 and that the table cover 40 is used instead of the table covers 40-1 and 40-2, as with the embodiment.

The present invention is not limited to the above embodiment and modifications. Various changes and modifications may be made in the illustrated embodiment and modifications without departing from the scope of the invention. According to the embodiment and modifications, the first processing unit 20, the second processing unit 70, and the third processing unit 20-3 are a cutting unit for performing a cutting process, a cleaning unit for performing a cleaning process, and an inspection unit for performing an inspecting process, respectively. However, the present invention is not limited such details. The processing units may alternatively include a grinding unit for grinding the workpiece 100, a polishing unit for polishing the workpiece 100, a laser processing unit for processing the workpiece 100 with a laser beam, a plasma processing unit for processing the workpiece 100 with plasma, an affixing unit for affixing a protective member to the workpiece 100, an ultraviolet applying unit for applying ultraviolet rays to the workpiece 100, or the like.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. An apparatus for processing a workpiece, comprising:
a holding table having a holding surface for holding the workpiece thereon;
a processing unit for processing the workpiece held on the holding surface of the holding table; and
a table cover for covering the holding surface when the workpiece is not held on the holding surface,
wherein the table cover has a contact surface for contacting at least the holding surface of the holding table, the contact surface being adhesive in nature.

2. The apparatus according to claim 1, wherein the table cover includes either an annular frame having a central opening and a sheet affixed to the annular frame or a plate-shaped member and a sheet affixed to the plate-shaped member.

3. The apparatus according to claim 1, further comprising:
a cassette for housing the workpiece therein; and
a delivery unit for delivering the workpiece between the cassette and the holding table,
wherein the table cover is housed in the cassette shared with the workpiece and is delivered between the cassette and the holding table by the delivery unit shared with the workpiece.

4. The apparatus according to claim 1, further comprising:
a cassette for housing the workpiece therein;
a table cover receptacle for housing the table cover; and
a delivery unit for delivering the workpiece between the cassette and the holding table,
wherein the table cover is delivered between the table cover receptacle and the holding table by the delivery unit shared with the workpiece.

5. A method of processing a workpiece, comprising:
a holding step of delivering the workpiece from a cassette to a holding table with use of a delivery unit and holding the workpiece on a holding surface of the holding table;
a processing step of processing the workpiece held on the holding surface with use of a processing unit; and
a table cover holding step of holding a table cover on the holding surface when the workpiece is not held on the holding surface.

6. The method according to claim 5, further comprising:
a table cover unloading step of unloading the table cover from the holding table,
wherein the table cover has a contact surface for contacting at least the holding surface of the holding table, the contact surface being adhesive in nature.

7. The method according to claim 6, wherein the table cover includes either an annular frame having a central opening and a sheet affixed to the annular frame or a plate-shaped member and a sheet affixed to the plate-shaped member.

* * * * *